(12) United States Patent
Shibata

(10) Patent No.: US 6,229,199 B1
(45) Date of Patent: May 8, 2001

(54) PACKAGED SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/092,117

(22) Filed: Jun. 5, 1998

(30) Foreign Application Priority Data

Jun. 6, 1997 (JP) ................................................. 9-149104

(51) Int. Cl.$^7$ ................................................. H01L 23/495
(52) U.S. Cl. .......................... 257/666; 257/669; 257/690; 257/784
(58) Field of Search .................................. 257/666, 669, 257/690, 692, 730, 784, 734

(56) References Cited

U.S. PATENT DOCUMENTS

| | | | |
|---|---|---|---|
| 3,623,649 | * | 11/1971 | Keisling ................................. 228/15.1 |
| 4,955,523 | * | 9/1990 | Calomagno et al. ............. 228/180.5 |
| 5,263,246 | * | 11/1993 | Aoki ........................................ 29/843 |
| 5,396,104 | * | 3/1995 | Kimura .................................. 257/784 |
| 5,776,786 | * | 7/1998 | Nakamura et al. .................. 438/106 |
| 5,808,354 | * | 9/1998 | Lee et al. .............................. 257/666 |

\* cited by examiner

*Primary Examiner*—Carl Whitehead, Jr.
*Assistant Examiner*—Jamie L. Davis
(74) *Attorney, Agent, or Firm*—Merchant & Gould P.C.

(57) ABSTRACT

A packaged semiconductor device is provided which includes a semiconductor chip, a die pad for mounting the semiconductor chip, and at least one bondwire. The bondwire has a first end connected to the semiconductor chip, a second end opposite to the first end, and a transitional portion extending from the second end. The semiconductor device also includes at least one lead having an inner portion connected to the second end of the bondwire and an outer portion, and a resin package for enclosing the semiconductor chip, the die pad, the bondwire and the inner portion of the lead. An angle defined between the inner portion of the lead and the transitional portion of the bondwire is no greater than 15 degrees.

4 Claims, 7 Drawing Sheets

F I G. 2
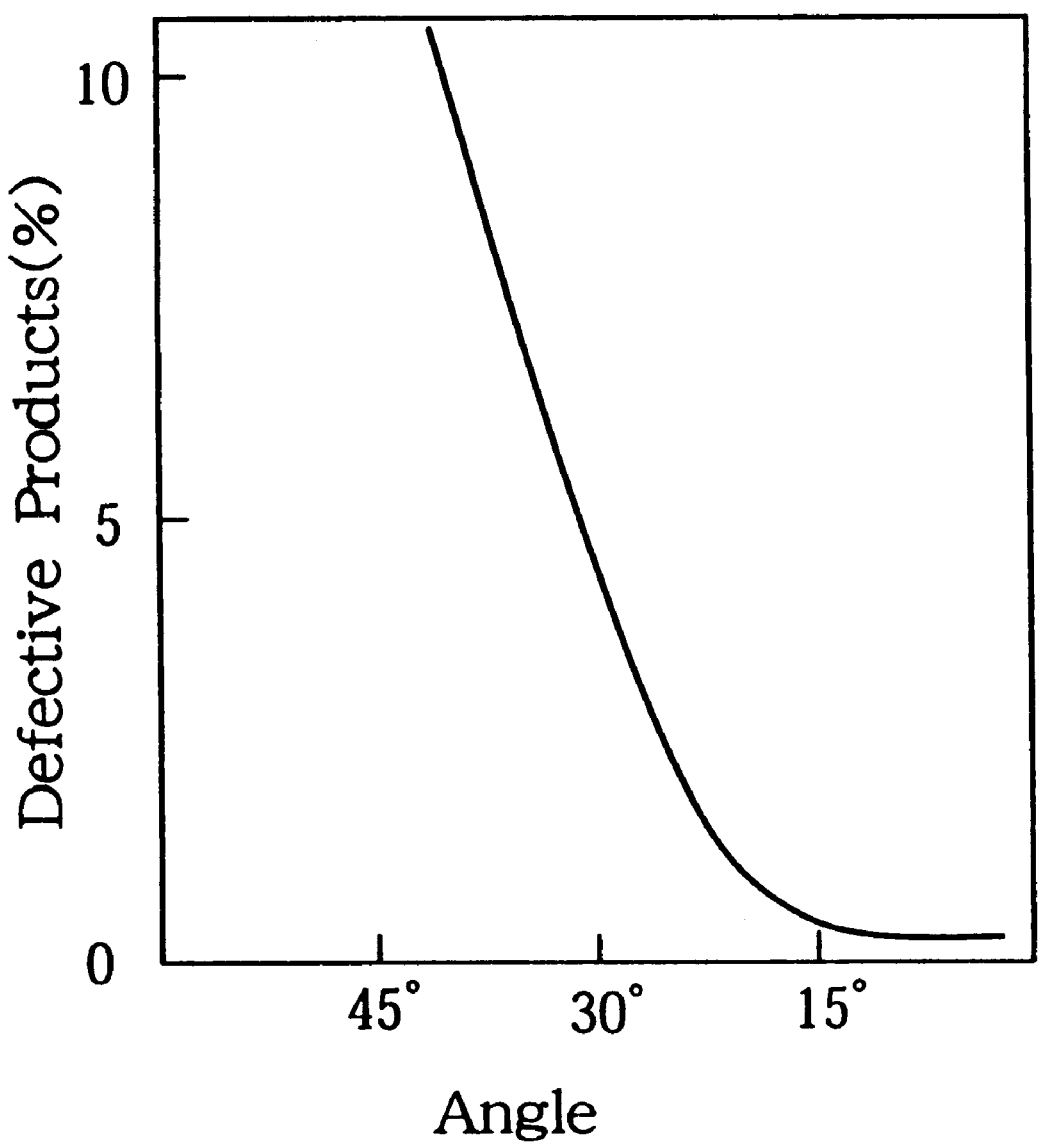

PACKAGED SEMICONDUCTOR DEVICE

BACKGROUND OF THE INVENTION

1. Field of the Invention

This invention relates to a packaged semiconductor device of the type which provides proper electrical conduction between bondwires and lead terminals within a resin package. The present invention also relates to a bonding structure concerning bondwires and leads used for such a packaged semiconductor device.

2. Description of the Related Art

An example of a conventional packaged semiconductor device is shown in FIGS. 7A and 7B. Of these figures, FIG. 7A is a sectional view showing the conventional semiconductor device, while FIG. 7B is an enlarged view of the encircled portion S in FIG. 7A.

The conventional packaged semiconductor device generally designated by reference 1 includes a semiconductor chip 10, a die pad 11 for mounting the chip 10, and a plurality of leads 13 electrically connected to the chip 10 via bondwires 12. Each bondwire 12, which may be made of gold for example, has a first end 12a attached to a bonding pad (not shown) formed on the upper surface of the chip 10, and a second end 12b attached to the upper surface of the inner portion 13a of a corresponding lead 13. The attaching of the bondwire 12 may be performed by a well-known thermocompression bonding method.

The semiconductor device 1 also includes a resin package 14 made of a thermosetting resin material such as epoxy. As shown in FIG. 7A, the resin package entirely encloses the chip 10 and the bondwires 12, while partially enclosing the leads 13. In this arrangement, each lead 13 has an inner portion 13a located within the package 14, and an outer portion 13b extended out of the package. As can be seen, the outer portion 13b first extends obliquely downward, and then bends to extend horizontally in its free end. The horizontal free end is in alignment with the bottom surface of the package 14, so that the semiconductor device 1 is easily mounted onto a printed circuit board (not shown).

As shown in FIG. 7B, the second end 12b of the bondwire 12 is reduced in thickness. This is because the above end is subject to compression by a presser member of a bonding machine used for the above-mentioned thermocompression bonding method. From the compressed second end 12b, a non-compressed portion 12c having a uniform diameter d extends obliquely upward. Conventionally, the angle α between the non-compressed portion 12c and the upper surface of the inner portion 13a is substantially equal to or greater than 30 degrees. There is a bending portion 12d between the compressed second end 12b and the non-compressed portion 12c.

The packaged semiconductor device 1 having the above arrangement is conveniently fixed to a printed circuit board by reflow soldering, as described below.

First, the semiconductor device 1 is placed on a printed circuit board in a manner such that the horizontal free ends of the respective leads 13 overlap solder paste which is applied beforehand to the circuit board. Then, the semiconductor device 1, together with the printed circuit board, is brought into a suitable furnace to be heated. At this stage, the solder paste arranged at each free end is liquidized due to heat, immersing the corresponding free end. Finally, by cooling the semiconductor device 1 and the printed circuit board, the melted solder material is solidified to fix the respective leads 13 to the circuit board.

However, the above semiconductor device 1 has been found to have the following disadvantage.

Specifically, when the semiconductor device 1 is heated in the furnace for melting the solder paste, the resin package 14 and bondwires 12 of the device 1 will expand due to the heat. Here, it should be noted that the expansion of the resin package 14 tends to be greater than that of the bondwires 12. Because of this, the resin package 14, as expanding, will give additional tension to the bondwire 12. When this happens, undesired stress due to the additional tension is concentrated at the bending portion 12d of the bondwire 12. Consequently, a crack or even larger break may be formed in a certain area of the compressed second end 12b of the bondwire 12, so that the product semiconductor device 1 may fail to provide intended function.

SUMMARY OF THE INVENTION

It is, therefore, an object of the present invention to provide a packaged semiconductor device capable of overcoming the problem described above.

Another object of the present invention is to provide a bonding structure concerning a bondwire and a lead, wherein the bondwire is reliably fixed to the lead without forming a crack in a compressed portion of the bondwire.

According to a first aspect of the present invention, there is provided a packaged semiconductor device comprising:

a semiconductor chip;

a die pad for mounting the semiconductor chip;

at least one bondwire having a first end connected to the semiconductor chip, a second end opposite to the first end, and a transitional portion extending from the second end;

at least one lead having an inner portion connected to the second end of the bondwire and an outer portion; and a resin package for enclosing the semiconductor chip, the die pad, the bondwire and the inner portion of the lead;

wherein an angle defined between the inner portion of the lead and the transitional portion of the bondwire is no greater than 15 degrees.

With such an arrangement, since the angle between the inner portion of the lead and the transitional portion of the bondwire is rendered sufficiently small, stress concentration at a bent portion between the second end and transitional portion of the bondwire is remarkably reduced. Thus, occurrence of a crack at the second end of the bondwire is prevented to a great extent.

According to a preferred embodiment, a length of the transitional portion is at least twice as great as a diameter of the transitional portion. More preferably, the above angle may be no greater than 10 degrees, or even 5 degrees According to a second aspect of the present invention, there is provided a packaged semiconductor device comprising:

a semiconductor chip;

a die pad for mounting the semiconductor chip;

at least one bondwire having a first end connected to the semiconductor chip, a second end opposite to the first end, and a transitional portion extending from the second end, the second end having a contact surface;

at least one lead having an inner portion attached to the contact surface of the second end of the bondwire, and an outer portion; and a resin package for enclosing the semiconductor chip, the die pad, the bondwire and the inner portion of the lead;

wherein an angle defined between the contact surface of the second end of the bondwire and the transitional portion of the bondwire is no greater than 15 degrees.

The second end of the bondwire may be smaller in thickness than the transitional portion of the bondwire.

According to a third aspect of the present invention, there is provided a packaged semiconductor device comprising:

a semiconductor chip;

a die pad for mounting the semiconductor chip;

at least one bondwire having a first end connected to the semiconductor chip, a second end opposite to the first end, and a transitional portion extending from the second end, the transitional portion including a first section directly continuous with the second end of the bondwire and a second section continuous with the first section;

at least one lead having an inner portion connected to the second end of the bondwire and an outer portion; and a resin package for enclosing the semiconductor chip, the die pad, the bondwire and the inner portion of the lead;

wherein the first section of the transitional portion extends in parallel to the inner portion of the lead in close contact therewith.

According to a fourth aspect of the present invention, there is provided a bonding structure comprising:

a bondwire including a connection end and a transitional portion extending from the connection end; and a lead attached to the connection end;

wherein an angle defined between the lead and the transitional portion of the bondwire is no greater than 15 degrees, a length of the transitional portion being at least twice as great as a diameter of the transitional portion.

Other objects, features and advantages of the present invention will be apparent from the detailed description of the embodiment given below with reference to the accompanying drawings.

BRIEF DESCRIPTION OF THE DRAWINGS

In the accompanying drawings:

FIG. 1A is a sectional view showing a packaged semiconductor device according to a first embodiment of the present invention, while

FIG. 2 is a graph showing the relation between the bonding angle of a bondwire with respect to a lead and the percentage of defective semiconductor devices;

FIG. 7A is a sectional view showing a conventional packaged semiconductor device, while

DETAILED DESCRIPTION OF THE PREFERRED EMBODIMENT

Figure 1A:
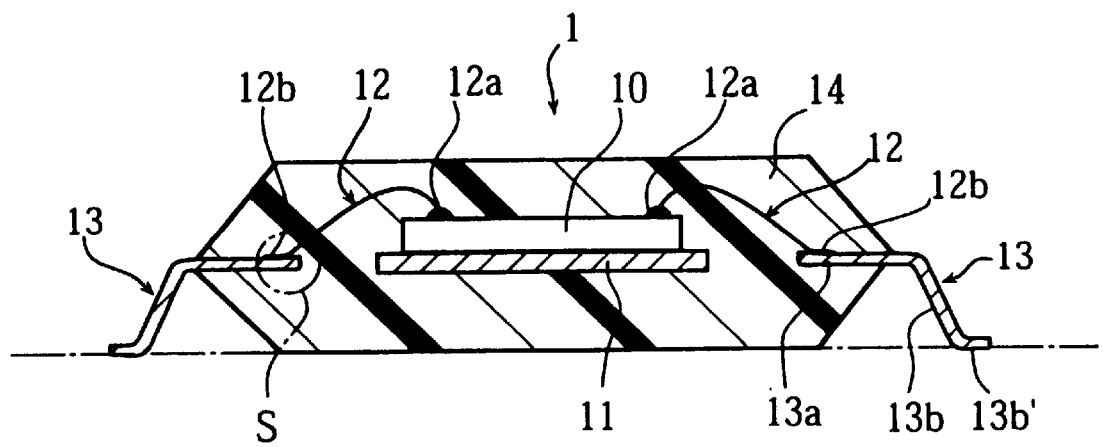

The preferred embodiments of the present invention will be described below with reference to the accompanying drawings. It should be noted that, throughout the figures, like parts are designated by the same reference numerals or characters.

Reference is first made to FIG. 1A which is a sectional view showing a packaged semiconductor device according to a first embodiment of the present invention. The semiconductor device generally designated by reference numeral 1 includes a semiconductor chip 10, a die pad 11 for mounting the chip 10, and a plurality of leads 13. As is shown, the semiconductor chip 10 and the leads 13 are electrically connected via bondwires 12 which may preferably be made of gold for example.

The semiconductor device 1 also includes a resin package 14 made of a thermosetting material such as epoxy. As can be seen, the above-mentioned chip 10, die pad 11, and bondwires 12 are enclosed by the resin package 14 entirely, whereas the leads 13 are only partly covered by the package. Thus, each lead 13 has a horizontally extending inner portion 13a arranged within the resin package 14, and an outer portion 13b extended out of the package. As shown in FIG. 1A, the outer portion 13b of the lead 13 first extends obliquely downward, and then bends to extend horizontally in its free end 13b', so that the free end 13b' is in alignment with the bottom surface of the resin package 14. In this arrangement, the semiconductor device 1 is stably mounted on a printed circuit board (not shown).

As shown in FIG. 1A, the above-mentioned bondwire 12 has a first end 12a connected to a bonding pad (not shown) formed on the upper surface of the chip 10, and a second end 12b connected to the upper surface of the inner portion 13a of the lead 13.

Figure 1B:
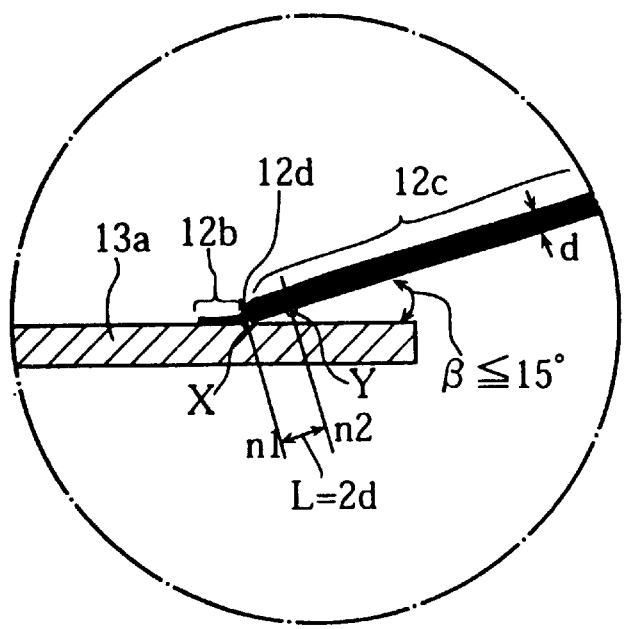
FIG. 1B is an enlarged view showing an encircled portion S in FIG. 1A.

Reference is now made to FIG. 1B which is an enlarged view of the encircled portion S in FIG. 1A. The second end 12b of the bondwire 12 is fixed to the lead 13 by a thermocompression bonding method. Thus, as in the conventional semiconductor device described hereinbefore, the second end 12b in FIG. 1B is also reduced in thickness, or compressed.

Adjacent to the second end 12b is a transitional portion or non-compressed portion 12c having a diameter d. According to the present invention, an angle β between the upper surface of the inner portion 13a and the non-compressed portion 12c is arranged to be no more than 15 degrees. Preferably, the angle β is no greater than 10 degrees. More preferably, the angle is no greater than 5 degrees.

Though the non-compressed portion 12c in FIG. 1B is depicted as straight, this is not necessarily the case. In other words, the non-compressed portion may be curved. In such an instance, the angle between the non-compressed portion 12c and the inner portion 13a is defined in the following manner.

Specifically, as shown in FIG. 1B, two points are selected on the lower side of the bondwire 12. One of them is a point X at which the second end 12b ends and the non-compressed portion 12c starts to extend obliquely from the second end 12b. The other is a point Y which is spaced from the point X by a distance L=2d, where d is the diameter of the non-compressed portion 12c, as mentioned above. Two lines n1 and n2 extending transversely of the non-compressed portion 12c are drawn so that they pass through the points X and Y, respectively. Thus, a limited section of the non-compressed portion 12c is defined between the lines n1 and n2. It should be appreciated that the limited section, since it is sufficiently small in length, can be regarded as extending straight (or substantially straight). As can be seen, even when the non-compressed portion 12c is not straight as a whole, the angle β can be defined as an angle made between the upper surface of the inner portion 13a and the straight line connecting the two points X and Y.

Here, as is easily understood, the lower surface of the second end 12b (or the contacting surface thereof) is flush with the upper surface of the inner portion 13a. Thus, for defining the angle β, the upper surface of the inner portion 13a can be replaced with the lower or contacting surface of the second end 12b of the bondwire 12.

According to the present invention, the angle β is rendered sufficiently small, as described above. As a result, unfavorable stress concentration at the bending portion 12d is prevented to a greater extent than is conventionally possible, and therefore the crack-forming problem at the compressed second end 12b is remarkably reduced or substantially eliminated.

The inventor has arrived at the present invention through experiments. Reference is now made to FIG. 2 which is a graph showing how the angle between a bondwire and a lead is related to the percentage of defective products. As is shown, the percentage of the defective products was remarkably reduced as the angle β became equal to or smaller than 15 degrees.

Figure 3:
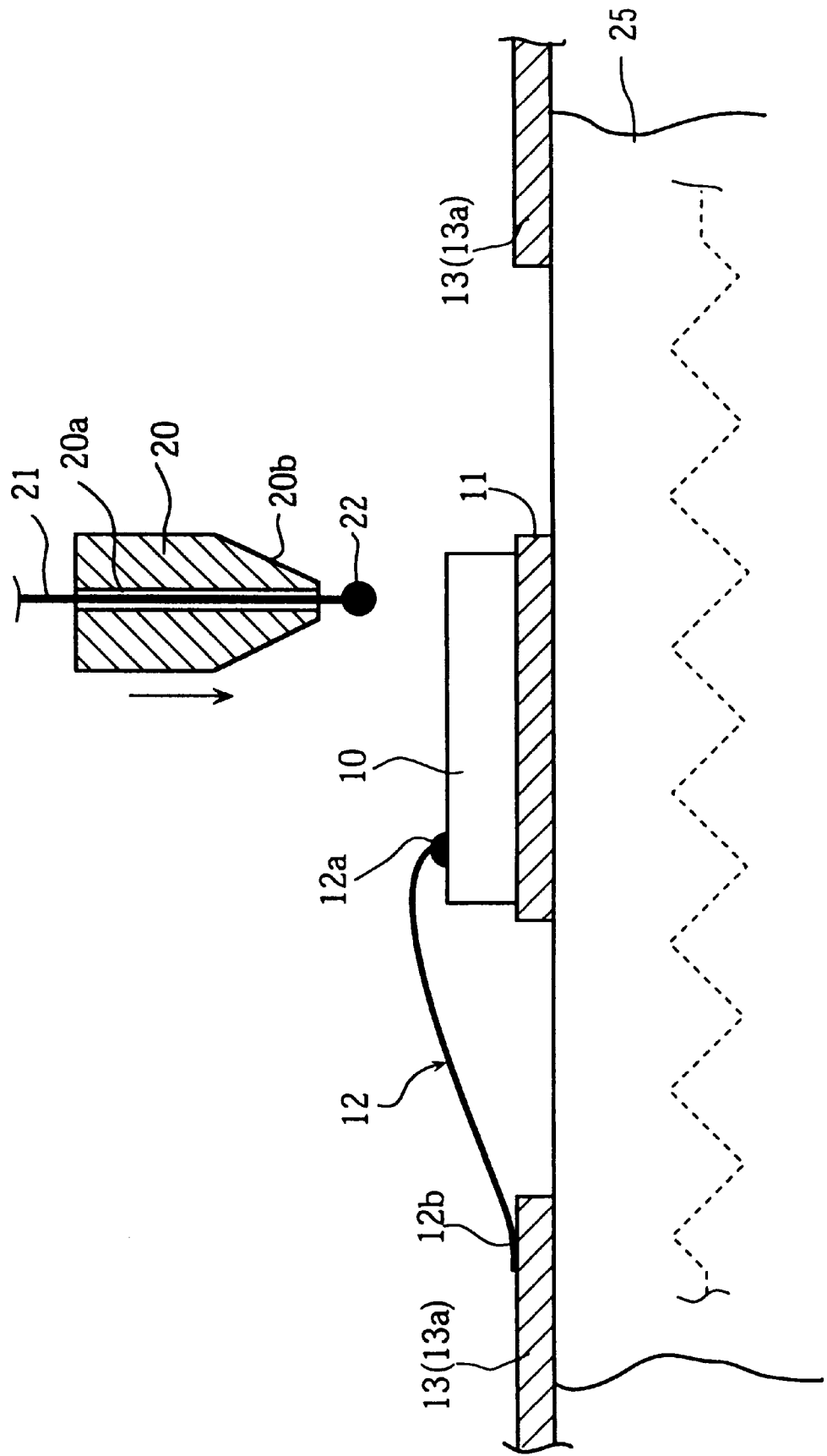
FIGS. 3–5 successively illustrate a method of making the semiconductor device according to the present invention.
Figure 4:
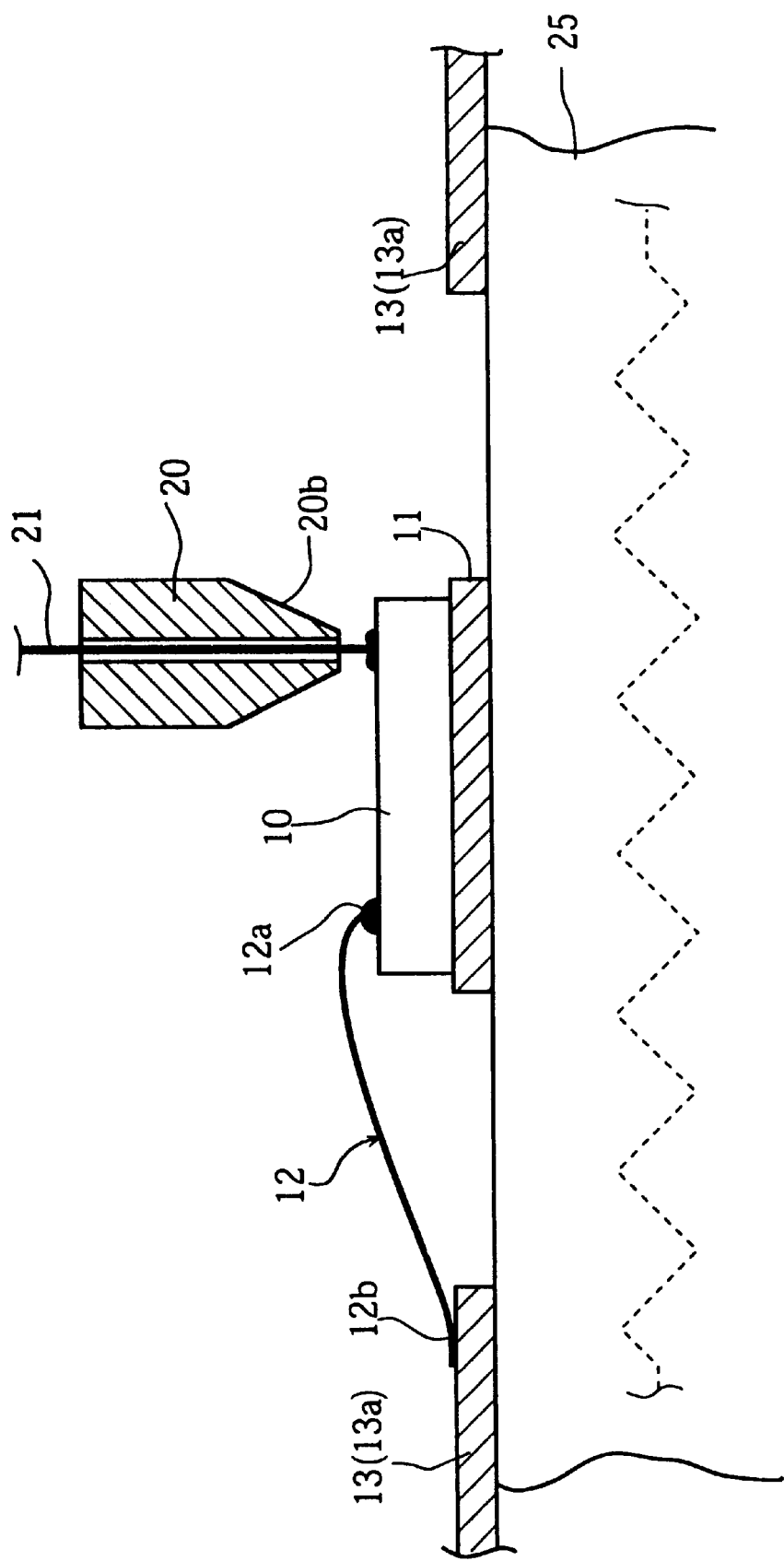
Figure 5:
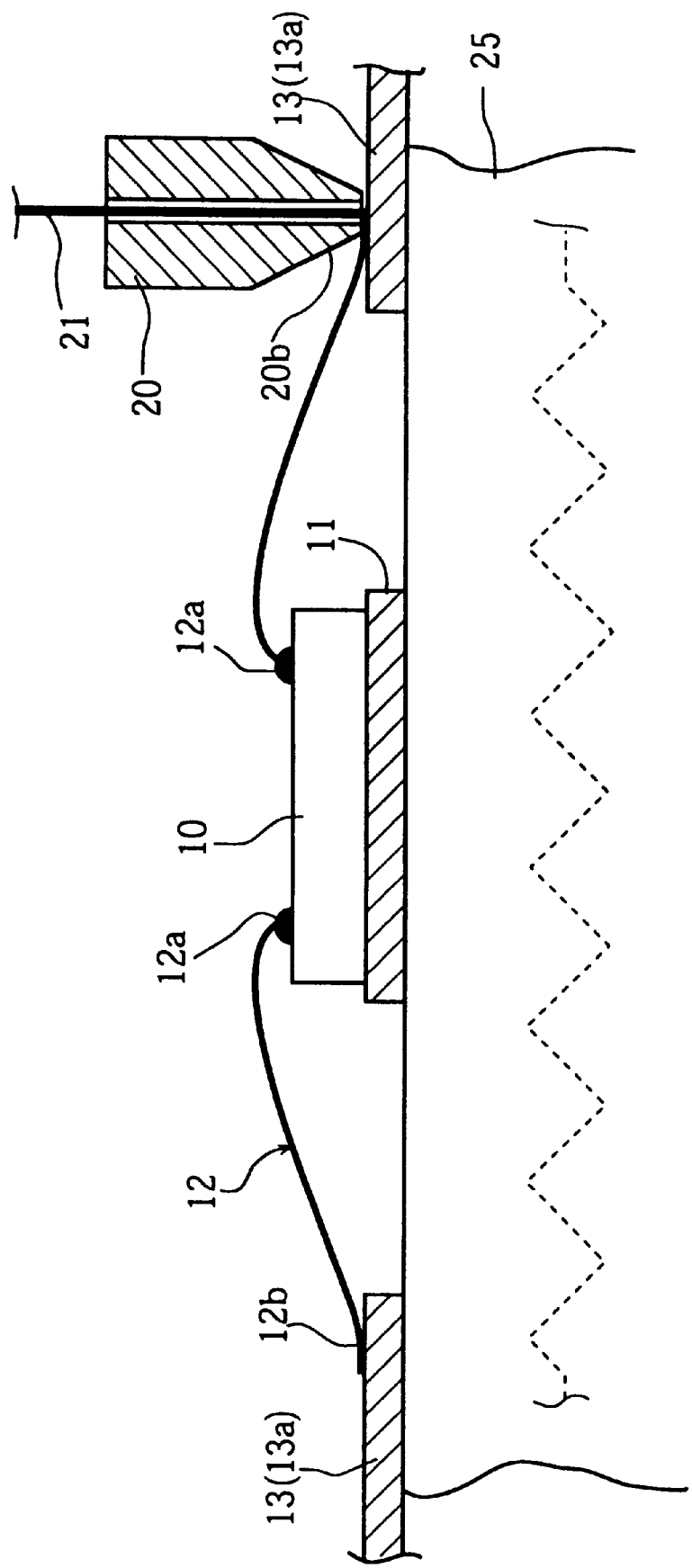

Reference will now be made to FIGS. 3–5 which illustrate a method of making a packaged semiconductor device 1 according to the first embodiment of the present invention.

According to the method, first a leadframe which is formed with die pads 11 and leads 13 is prepared. Such a leadframe may be obtained by punching a thin metal sheet for example. Then, a semiconductor chip 10 is mounted on each die pad 11.

Thereafter, the semiconductor chip 10 is electrically connected to the leads 13 via bondwires 12. The bonding of the bondwires 12 is conveniently performed by a thermocompression bonding method using a capillary tool 20 shown in FIG. 3. As can be seen, the capillary tool 20 is formed with a passage 20a extending therethrough for allowing passage of wire 21 made of gold. The capillary tool 20 is also provided with a nozzle portion 20b tapering downwardly. The tip (or the lower end) of the wire 21 is extended out of the nozzle portion 20b.

With the use of the capillary tool 20, the bondwire 12 is attached to the semiconductor chip 10 and the lead 13 in the following manner.

First, the above leadframe is placed on a heater block 25 to be heated to a temperature of about 400° C., while the exposed tip of the wire 21 is thermally melted by a suitable torch (not shown) to be formed into a ball end 22, as shown in FIG. 3. Then, as shown in FIG. 4, the capillary tool 20 is lowered to bring the ball end 22 into pressing contact with a bonding pad (not shown) formed on the upper surface of the chip 10. As a result, the compressed ball end is compressed to be attached to the bonding pad.

Then, while the wire 21 is being paid out from the nozzle portion 20a, the capillary tool 20 is moved along a predetermined path between the semiconductor chip 10 and the lead 13, before the tool 20 is brought to a position shown in FIG. 5. As can be easily understood, the predetermined path should be chosen so that the angle between the resulting bondwire 12 and the upper surface of the lead 13 is no greater than 15 degrees.

In the above-mentioned position shown in FIG. 5, the wire 21 is brought into pressing contact with the upper surface of the lead 13. Here, it should be appreciated that the wire 21 and the lead 13 are readily attached to each other, since the lead 13 is heated by the heater block 25.

After the pressed portion of the wire 21 is properly attached to the upper surface of the lead 13, the capillary tool 20 is moved sideways (to the right in FIG. 5) away from the connected portion, while the paying-out of the wire 21 is being stopped. In this way, it is possible to cut the wire 21 at the attached portion without using an additional cutting tool.

After the bonding procedure is completed, the semiconductor chip 10, the die pad 11, the bondwires 12 and the inner portions 13a of the leads 13 are enclosed by a suitable resin package in a known manner.

Then, other well-known procedures (such as solder-plating and cutting for the leadframe, and bending for the leads 13) are performed to finally produce the semiconductor device 1 shown in FIG. 1A.

Figure 6:
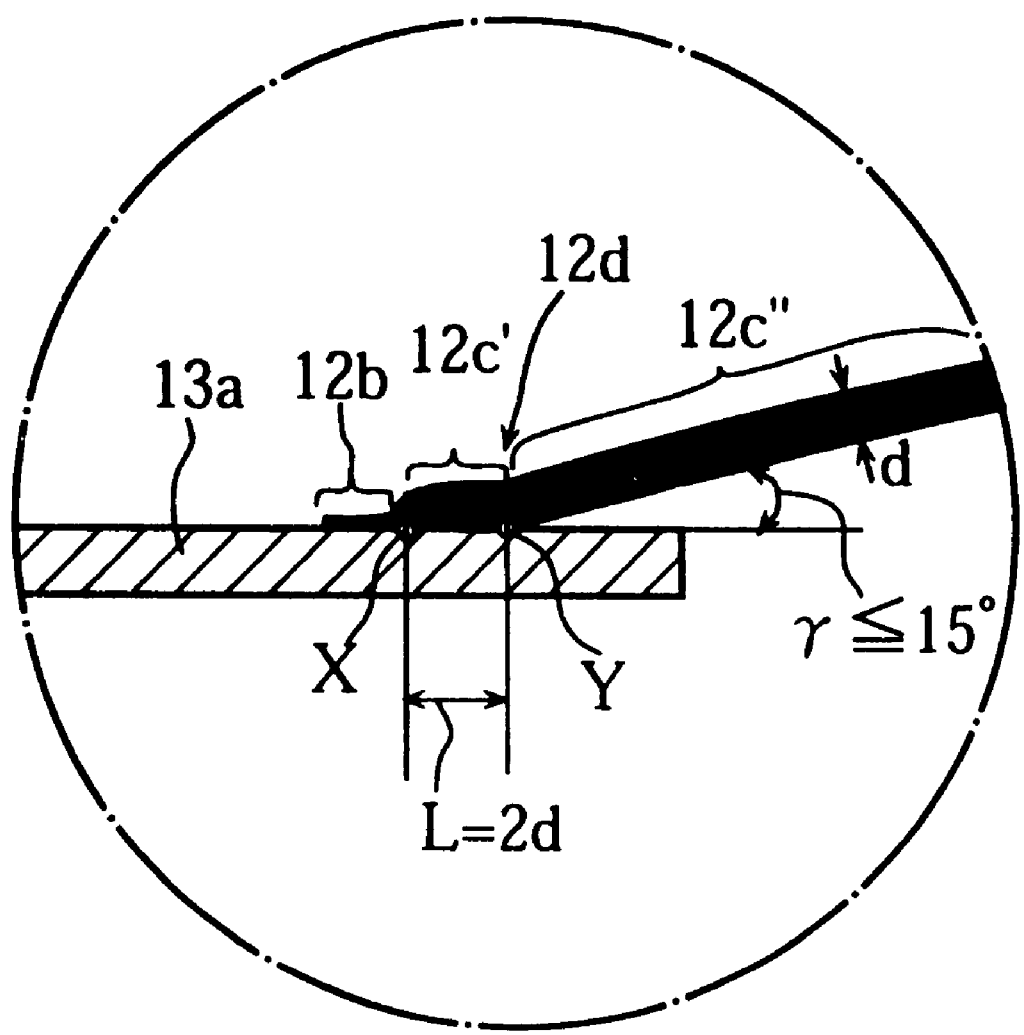
FIG. 6 is a sectional view showing a bonding structure of a bondwire and a lead of a semiconductor device according to a second embodiment of the present invention.
Figure 7A:
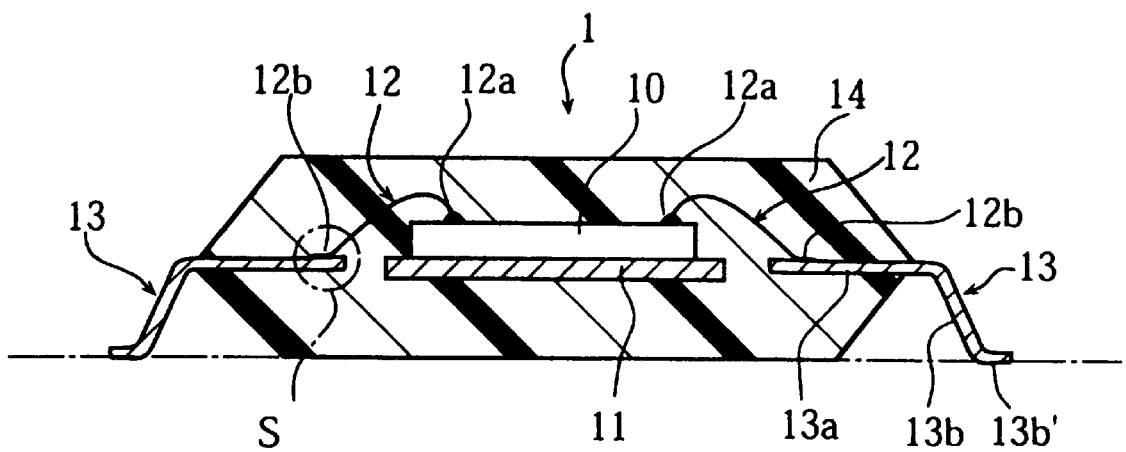
Figure 7B:
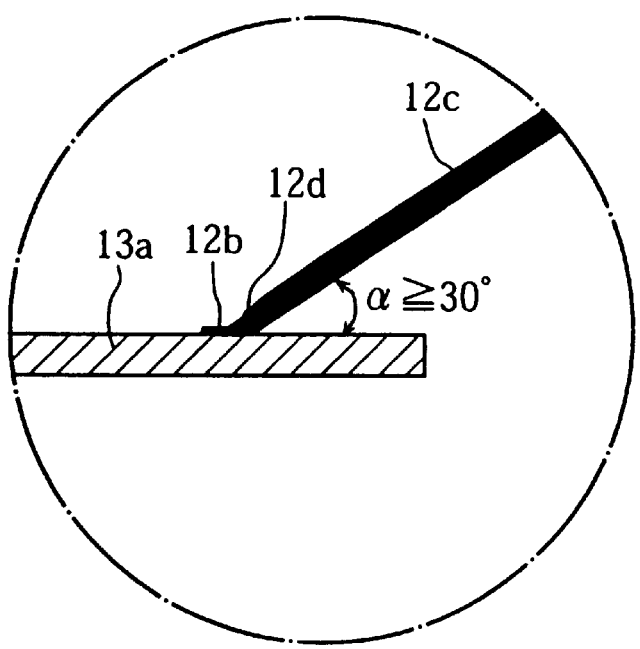
FIG. 7B is an enlarged view showing an encircled portion S in FIG. 7A.

Reference is now made to FIG. 6 which is an enlarged view illustrating a bonding structure concerning a bondwire 12 and a lead 13 of a semiconductor device according to a second embodiment of the present invention. Except for the bonding structure, the semiconductor device according to the second embodiment is basically similar to that of the first embodiment. Thus, no overall picture of the semiconductor device of the second embodiment is given.

As can be seen from FIG. 6, the bonding structure is similar to that of FIG. 1B, except that the non-compressed portion is divided into two sections in the following manner.

Specifically, the non-compressed portion includes a first section 12c' continuous with the second end 12b, and a second section 12c" continuous with the first section 12c'. The first section 12c', which extends in parallel to the inner portion 13a of the lead 13, has a length of L=2d defined between two points X and Y. The first section 12c' is only held in contact with the upper surface of the inner portion 13a but not fixed thereto. The second section 12c" extends obliquely upward from the first section 12c' at an angle γ with respect to the upper surface of the inner portion 13a. According to the present invention, the angle γ is also set to be no greater than 15 degrees.

With this arrangement again, the concentration of undesired stress at the bending portion 12d is advantageously reduced, since the angle γ is rendered no greater than 15 degrees. Thus, the unfavorable crack-forming in the second end 12b is effectively prevented.

Further, in the second embodiment, the bending portion 12d is provided between the first and second non-compressed sections which are both greater in thickness (or stronger) than the second end 12b. Thus, even if stress concentration occurs at the bending portion 12d, the first and second sections 12c' and 12c" are less likely to be broken by the stress concentration than the second end 12b. Still further, the second end 12b is spaced from the bending portion 12d by the distance L. Thus, the second end 12b itself is effectively prevented from being damaged by the stress concentration.

In the above embodiment, the length L of the first non-compressed section 12c' is equal to 2d. However, this is not limitative, and it is possible to make the first section 12c' much longer.

The present invention being thus described, it is obvious that the same may be varied in many ways. Such variations should not be regarded as a departure from the spirit and scope of the present invention, and all such modifications as would be obvious to those skilled in the art are intended to be included within the scope of the following claims.

What is claimed is:

1. A packaged semiconductor device comprising:

a semiconductor chip;

a die pad for mounting the semiconductor chip;

at least one bondwire having a first end connected to the semiconductor chip, a second end opposite to the first end, and a transitional portion extending from the second end, the transitional portion including a first non-compressed section directly continuous with the second end of the bondwire and a second non-compressed section continuous with the first non-compressed section;

at least one lead having an inner portion connected to the second end of the bondwire and an outer portion; and a resin package for enclosing the semiconductor chip, the die pad, the bondwire and the inner portion of the lead;

wherein the first non-compressed section of the transitional portion extends in parallel to the inner portion of the lead in close contact therewith, the second non-compressed section of the transitional portion being bent relative to the first non-compressed section.

2. The packaged semiconductor device according to claim 1, wherein the first non-compressed section of the transitional portion has a length which is at least twice as great as a diameter of said first section.

3. The packaged semiconductor device according to claim 1, wherein an angle defined between the inner portion of the lead and the second non-compressed section of the transitional portion is no greater than 15 degrees.

4. A packaged semiconductor device comprising:

a semiconductor chip;

a die pad for mounting the semiconductor chip;

at least one bondwire having a first end connected to the semiconductor chip, a second end opposite to the first end, and a transitional portion extending from the second end, the transitional portion including a first section directly continuous with the second end of the bondwire and a second section continuous with the first section;

at least one lead having an inner portion connected to the second end of the bondwire and an outer portion; and a resin package for enclosing the semiconductor chip, the die pad, the bondwire and the inner portion of the lead;

wherein the first section of the transitional portion extends in parallel to the inner portion of the lead in close contact therewith and has a length at least twice as great as a diameter of said first section.

* * * * *